US010756803B2

(12) United States Patent
Leulescu et al.

(10) Patent No.: US 10,756,803 B2
(45) Date of Patent: Aug. 25, 2020

(54) SYSTEM, APPARATUS AND METHOD FOR DYNAMIC CARRIER AGGREGATION TO MULTI-BEAM ANTENNA MAPPING

(71) Applicant: BLiNQ Networks Inc., Markham (CA)

(72) Inventors: Ovidiu Mihai Leulescu, Aurora (CA); Radu Bogdan Selea, Vaughan (CA); Terasan Niyomsataya, Nepean (CA)

(73) Assignee: BLiNQ Networks Inc., Markham (CA)

( * ) Notice: Subject to any disclaimer, the term of this patent is extended or adjusted under 35 U.S.C. 154(b) by 0 days.

(21) Appl. No.: 16/451,833

(22) Filed: Jun. 25, 2019

(65) Prior Publication Data

US 2020/0028561 A1  Jan. 23, 2020

Related U.S. Application Data

(60) Provisional application No. 62/699,531, filed on Jul. 17, 2018.

(51) Int. Cl.
*H04B 7/06* (2006.01)
(52) U.S. Cl.
CPC .... *H04B 7/0691* (2013.01); *H01L 2924/0002* (2013.01)
(58) Field of Classification Search
USPC ................................................. 370/330, 297
See application file for complete search history.

(56) References Cited

U.S. PATENT DOCUMENTS

| | | | | |
|---|---|---|---|---|
| 5,933,421 | A | * | 8/1999 | Alamouti ............. H04B 7/0837 370/203 |
| 7,043,259 | B1 | * | 5/2006 | Trott ..................... H04W 16/10 370/328 |
| 9,036,583 | B2 | | 5/2015 | Lim et al. |
| 9,641,213 | B2 | * | 5/2017 | Oh ....................... H04B 1/0057 |
| 2012/0294299 | A1 | | 11/2012 | Fernando |
| 2013/0051284 | A1 | | 2/2013 | Khlat |
| 2014/0227982 | A1 | | 8/2014 | Granger-Jones et al. |
| 2015/0295596 | A1 | * | 10/2015 | Wloczysiak .......... H04W 76/28 370/297 |
| 2017/0063404 | A1 | | 3/2017 | Langer |
| 2019/0036217 | A1 | * | 1/2019 | Presti ..................... H01Q 5/328 |

* cited by examiner

*Primary Examiner* — Eva Y Puente
(74) *Attorney, Agent, or Firm* — de Wilton Intellectual Property Inc.

(57) ABSTRACT

A multi-beam antenna system, apparatus and method for dynamic carrier aggregation to multi-beam antenna mapping in radio access networks, including small-cell deployments, is disclosed. Apparatus comprises a compact base transceiver unit with integrated multi-beam antenna comprising antenna groups configurable for operation in a plurality of modes, with one or more selected antenna groups enabled, for different use-case scenarios. The base transceiver unit comprises a daisy-chained radio-frequency (RF) system wherein one baseband processor feeds multiple RF transceivers; each RF transceiver front end comprises a software configurable isolation module through which each RF front end is interlinked to previous and next RF front ends to enable dynamic routing of TX/RX data streams through the daisy chain, e.g. routing a transmission data stream from any RF transceiver to any one of the antenna groups or multiple antenna groups, routing a received data stream from one or multiple antenna groups to any RF transceiver, and for contiguous or non-contiguous carrier aggregation.

25 Claims, 9 Drawing Sheets

Multi-beam antenna system

Examples of Multi-Mode operation of the Multi-beam antenna system

SYSTEM, APPARATUS AND METHOD FOR DYNAMIC CARRIER AGGREGATION TO MULTI-BEAM ANTENNA MAPPING

CROSS-REFERENCE TO RELATED APPLICATIONS

This application claims priority from U.S. provisional patent application No. 62/699,531 filed Jul. 17, 2018, entitled "System, Apparatus and Method for Dynamic Carrier Aggregation to Multi-Beam Antenna Mapping", which is incorporated by reference in its entirety.

TECHNICAL FIELD

The present invention relates generally to telecommunications service technology for radio access networks, and systems, apparatus and methods using smart antenna technology and carrier aggregation for improved network capacity.

BACKGROUND

Variability of capacity demand is one of the main challenges to be addressed in wireless cellular deployments. In both macro-cell and small-cell deployments, capacity demand may be variable by location and by time of day (ToD), or to accommodate planned or unplanned events.

A macro-cell or macro-site is a large area cell in a mobile access network that provides radio coverage served by an outdoor high-power cell site comprising a base transceiver station (BTS), which may be referred to as a MACRO BTS, with high power antennas which are mounted on towers, masts, or other raised structures above the clutter, i.e. at a height that provides a line of sight (LOS) over the most of the surrounding buildings and terrain, with coverage having a range of 1 to 10 kilometers or more. Outdoor small-cells comprise lower power, more compact base-stations and antenna which are usually deployed below the clutter, e.g. mounted on existing street infrastructure, such as utility poles, strands, lamp posts, or on the sides of buildings, to provide localized enhanced coverage. For example, in dense urban areas small-cells may be used to fill coverage gaps, e.g. where tall buildings block coverage by a macro-cell, or to provide enhanced service to meet capacity demand for high traffic environments, or hotspots, at street level. More generally, small-cell deployments may include what are referred to as micro-cells, pico-cells and femto-cells. Micro-cells provide coverage for smaller areas than macro-cells, e.g. providing coverage with a range of hundreds of meters, extending several city blocks, over plazas and event spaces, transit hubs, etc., and with capacity for serving hundreds of users. Pico-cells and femto-cells cover smaller outdoor and indoor areas and serve a more limited number of users.

In the MACRO BTS world, where installations are mounted on a tower or on top of a building, the issue of capacity demand tends to be addressed by using a distributed architecture and/or an Adaptive Antenna System (AAS).

In a conventional distributed radio access network (RAN) architecture, a radio transceiver is mounted on an antenna tower or mast, close to the antenna, and connected to a ground level base transceiver station (BTS) by copper or coax cable. That is, the high-power radio and antennas are mounted on the tower, separated from the baseband processor unit, which is located the foot of the tower, in a cabinet that includes the power supply and an active cooling system. The radio unit may be referred to as RRU (Remote Radio Unit) or RRH (Remote Radio Head). The baseband processor unit may be referred to as a BBU (baseband unit). In cloud RAN architectures (C-RAN), a transceiver and antenna are mounted on a tower or mast and connected by a fiber link (fronthaul link), e.g. using CPRI (Common Public Radio Interface), to an optical BBU located at a central office, or other centralized BBU location some distance away, which also serves other transceivers and antennas, and provides a centralized base-station control system (BCS). Each BBU serves multiple RRHs, so that capacity can be routed to RRHs as required. This CPRI architecture allows for a flexible distribution of baseband resources to radio resources.

AAS solutions use multiple antenna elements for transmitting and/or receiving, which can be configured to cover multiple use-case scenarios using technologies, such as, multi-beam antennas and advanced full-dimension (FD) digital beamforming.

Carrier Aggregation (CA) may be used to address capacity demand. Carrier aggregation is a scheme for transmitting data to a terminal or User Equipment (UE) multiple different unit carriers, or component carriers (CC), to increase data rates. As an example, LTE-A release 8/9 provides for carrier aggregation of up to 5 CC, each having a bandwidth of 20 MHz and providing up to 130 Mbps per CC, to extend the bandwidth to 100 MHz. Carrier aggregation may be intra-band contiguous aggregation, intra-band non-contiguous aggregation and inter-band non-contiguous. Thus, using a combination of CPRI architecture, AAS using multiple antenna elements, and carrier aggregation, network capacity for macro-cell deployments can be steered to a specific RRH and antenna elements to cover an area where capacity is required.

The following references provide some examples of apparatus and methods for carrier aggregation for uplink and downlink: U.S. Pat. No. 9,036,583 entitled "Transmission method and apparatus for carrier aggregation and uplink MIMO", issued 19 May 2015 (Lim et al.); US20120294299A1 entitled "Non-Adjacent Carrier Aggregation Architecture" published 22 Nov. 2012 (Fernando); US20130051284A1 entitled "Carrier Aggregation Radio System" (Khlat) published 28 Feb. 2013; US20140227982A1 entitled "Front End Circuitry for Carrier Aggregation Configurations" (Granger-Jones et al.) published 14 Aug. 2014.

The system architectures and solutions used for MACRO BTS may not be applicable to small-cell deployments for several reasons, e.g.: high costs, large form factor, high power consumption, active cooling, and in particular, deployment use-case.

As mentioned above, antennas for macro-cells are mounted high above the clutter, on masts, towers, or on tall buildings and use, for example, large scale tri-sector antenna to provide high power coverage over an extended range of the surrounding area, for various network morphologies, e.g. urban areas or rural terrain. Moreover, using a common BTS platform connected by CPRI to multiple RRHs, capacity can be routed at baseband level towards different RRHs. In this way, processing power required for CA can be used towards one RRH or another.

Small-cells differ in that the baseband processor and radio components, i.e. the RF transceiver and RF front end, are fully integrated into a small form factor unit, with an integrated antenna or attached antenna. In an LTE Radio Access Network, small-cell units may be referred to as eNodeB or eNB. In high density urban areas, outdoor small-cells are usually deployed at street level, e.g. mounted on a pole or lamp-post at about 18 feet above the ground. In most cases, surrounding buildings are at the same height and there may be tall buildings that are significantly higher than the installation point. For this reason, small-cell antenna patterns are highly influenced by the clutter and usage of sophisticated beamforming technologies is not very efficient. Thus, small-cells typically use omni-directional or quasi-omni-directional antenna architectures as a compromise for different street level use-cases, e.g. as a trade-off for the canyon effect and location dependent propagation effects.

There is a need for alternative solutions which improve or optimize current small-cell architectures. For example, there is a need for a cost effective, low form factor, small-cell architecture that provides for carrier aggregation, and enables one or more of: improved or optimized cell coverage, improved user experience and fit to any network morphology.

SUMMARY OF INVENTION

The present invention seeks to eliminate or mitigate one or more disadvantages of known systems, apparatus and methods using smart antenna technology and carrier aggregation, or at least provide an alternative.

Aspects of the invention provide a configurable multi-beam antenna system architecture for a radio access network and an apparatus and method for dynamic carrier aggregation to multi-beam antenna mapping, having particular application to small-cell deployments.

In one aspect, an apparatus comprises a compact base transceiver unit with an integrated multi-beam antenna. The multi-beam antenna comprises antenna groups which are software configurable for operation in a plurality of modes using one or more selected antenna groups to address different use-case scenarios. The base transceiver unit comprises a daisy chained radio frequency (RF) system wherein one baseband processor feeds multiple RF transceivers, each transceiver being connected to one or more multi-beam antennas. The hardware design enables routing of each transceiver data stream to any one of the antenna groups of each antenna. Each transceiver front end comprises a software configurable isolation module providing dual functionality for multi-sector operation wherein one CC maps to one antenna group and for carrier aggregation wherein multiple component carriers are mapped to one antenna group.

In another aspect, a method for dynamic carrier aggregation is disclosed wherein the capacity of multiple component carriers (CC) is mapped dynamically to a multi-beam antenna system. Software configurable mapping of one CC or multiple CCs to antenna beams creates a small-cell BTS that can adapt dynamically to different urban morphologies and user distributions.

In a further aspect, a multi-beam antenna system architecture is disclosed which can be configured to provide increased cell coverage and improved user experience, and is adaptable for any type of network morphology.

For example, an apparatus for dynamic carrier aggregation to antenna mapping in a radio access network is provided, comprising:
a baseband processor having a communication interface for data and control signals;
a set of a plurality of RF (radio frequency) transceivers which collectively provide bandwidth for operation with multiple contiguous and non-contiguous component carriers (CC) of at least one spectral band;
the baseband processor serving each of the plurality of RF transceivers through respective digital interfaces;
a set of a plurality of antenna groups each comprising a plurality of directional antenna elements;
each RF transceiver being linked to an antenna port connected to one of the plurality of antenna groups; and
the RF transceivers being interlinked in a daisy chain configuration wherein for a set of N RF transceivers, and N antenna groups, for n=1, 2, . . . N, RF front end n has a link to RF front end n−1 and a link to RF front end n+1, interconnections between the N RF transceivers, N RF front ends and N antenna groups being dynamically configurable to enable an RF data stream from each of the N RF transceivers to be routed through the daisy chain to any one of the N antenna groups or to multiple antenna groups, and to enable an RF data stream from each of the N antenna groups to be routed through the daisy chain to any one of the RF transceivers.

RF front end N may have a link to RF front end 1 and a link to RF front end N−1 to form a daisy chain loop.

In an embodiment, said links are provided by an interconnection between RF front end n and RF front end n−1 and an interconnection between RF Front end n and RF front end n+1.

For example, each RF front end n comprises an isolation module n, and said interconnections between RF front end n and RF front end n−1 and between RF Front end n and RF front end n+1 are made through the isolation module n,
each isolation module n comprising a plurality of software configurable switches for dynamically configuring routing of a transmit (TX) data stream from each RF transceiver to one or multiple antenna groups and routing of a receive (RX) data stream from each antenna group to any one of the RF transceivers.

In one embodiment, each RF transceiver n is linked to antenna port n through an RF front end n comprising an isolation module n, and each isolation module n comprises first and second isolation blocks,
the first isolation block of the isolation module n of RF front end n being linked to the RF transceiver n and linked to the second isolation block of RF Front end n−1;
the second isolation block of the isolation module n of RF front end n being linked to the antenna port of antenna group n and linked to the first isolation block of RF front end n+1;
the first isolation block comprising software configurable switches configurable for selecting and routing transmit signals TXn from RF transceiver n and TXn−1 from Front end module n−1, and receive signals RXn from antenna group n and RXn−1 from Front end module n−1;
the second isolation block comprising software configurable switches configurable for selecting and routing of transmit signals TXn from RF transceiver n and TXn+1 from Front end module n+1, and receive signals RXn from antenna group n and RXn+1 from Front end module n+1.

The software configurable switches of each isolation module may comprise an arrangement of software configurable bidirectional switches and each RF front end n comprises front end circuitry including a software configurable switch for enabling and disabling antenna group n, thereby enabling operation with any one of the plurality of antenna groups individually and operation with any combination of one, two or more of the plurality of antenna groups, e.g. responsive to use-case scenario and capacity demand.

For example, the multi-beam antenna system comprises a plurality of antenna groups wherein a first antenna group provides a first directional coverage, and a second antenna group provides a second directional coverage which is orthogonal to coverage of the first antenna group, switches of the front end modules being configurable to enable/disable the first and second antenna groups for dynamically operating one or both antenna groups to adapt to different use-case scenarios and capacity demand. A third antenna group may be provided for coverage filling nulls between said first and second antenna groups, and wherein said switches of the front end modules configurable to enable/disable any one of the first, second and third antenna groups, for dynamically operating any one of the first, second and third antenna groups and any combination of first, second and third antenna groups, to adapt to different use-case scenarios and capacity demand.

Embodiments are described wherein each antenna group provides a different pattern of directional coverage, and said switch configurations provide for dynamically enabling/disabling antenna groups to provide one of a set of predetermined coverage patterns responsive to use-case scenario, to adapt to different network morphologies, and to add capacity to one or more specific areas.

For example, when the plurality of antenna groups consists of three antenna groups, antenna group B0 comprises a first set of directional antenna elements providing bi-directional coverage; antenna group B1 comprises a second set of directional antenna elements providing bi-directional coverage orthogonal to the first set of directional antenna elements; and antenna group B2 comprises a third set of directional antenna elements filling nulls of antenna groups B0 and B2.

For operation with a plurality of component carriers (CC), switches of the isolation modules are configurable to enable carrier overlay and to enable carrier aggregation, wherein carrier aggregation comprises intra-band contiguous, intra-band non-contiguous and inter-band non-contiguous carrier aggregation.

As an example, for operation with a plurality of component carriers (CC) of the Citizens Broadband Radio System (CBRS) band, each of the N RF transceivers has a bandwidth covering part of the 150 MHz of the CBRS band, to collectively cover the entire CBRS band, and enable carrier aggregation of any combination of contiguous or non-contiguous CC of the CBRS band. For N=3, and the 3 RF transceivers each have a bandwidth of 50 MHz, and wherein switch configurations of the isolations modules provide for multiple modes of operation responsive to use-case scenario and capacity demand, with any one, two or three of the three antenna groups enabled, and with routing of any combination of contiguous or non-contiguous CC for carrier overlay or carrier aggregation.

For compact small cell deployments, components of the base station, i.e. the baseband processor, the plurality of RF transceivers, the RF front ends and the plurality of antenna groups are integrated within a single enclosure (housing), e.g. a strand-mountable enclosure, or enclosure which is configured for mounting on a pole, lamp-post, wall of a building or other existing street infrastructure.

Also provided is a multi-beam antenna system comprising a plurality of groups of directional antenna elements B0, B1 . . . BN,
wherein each group of antenna elements is linked to a respective RF transceiver port 0, 1, . . . N, through an RF Front end 0, 1, . . . N, for connection to N RF transceivers providing bandwidth for operation with multiple contiguous and non-contiguous component carriers (CC) of at least one spectral band, the N RF front ends comprising front end circuitry for selectively enabling and disabling each antenna group and the N RF front ends being interlinked in a daisy chain configuration,
each N RF front end comprising an isolation module comprising software configurable switches wherein switch configurations enable an RF data stream from each of the RF transceiver ports to be routed through the daisy chain to any one of the N antenna groups or to multiple antenna groups and enable an RF data stream from each of the N antenna groups to be routed through the daisy chain to any one of the RF transceivers.

The switch configurations provide for dynamically enabling/disabling antenna groups and dynamic mapping of component carriers to antenna groups for operation in a plurality of modes of operation responsive to use-case scenario and capacity demand. A component carrier physically linked to a disabled antenna group is routed to the next enabled antenna group.

For example, in a multi-beam antenna system comprising 3 antenna groups, antenna group B0 comprises a first set of directional antenna elements providing bi-directional coverage; antenna group B1 comprises a second set of directional antenna elements providing bi-directional coverage orthogonal to the first antenna group; and antenna group B2 comprises a third set of directional antenna element filling nulls of antenna groups B0 and B2.

By way of example, for a first use-case (e.g. canyon), a first mode of operation comprises enabling one of antenna group B0 and antenna group B1 to provide bi-directional coverage; for a second use-case (e.g. intersection), a second mode of operation comprises enabling antenna groups B0 and B1 to provide four-directional coverage; and for a third use case (e.g. plaza/residential open area), enabling antenna group B2 or enabling antenna groups B0, B1 and B2 to provide omnidirectional or quasi-omnidirectional coverage. This system may be for operation with three component carriers, contiguous or non-contiguous, wherein said switch configurations provide for modes of operation comprising carrier overlay and carrier aggregation.

Also provided a method of dynamic carrier aggregation to multi-beam antenna mapping in a radio access network comprising a plurality of base stations and a distributed or centralized network controller, wherein each base station comprising an apparatus as defined herein, comprising a baseband processor, a plurality of RF transceivers, RF front ends and antenna groups, wherein RF front ends are interlinked in a daisy chain configuration with software configurable switches of isolation modules of the RF front ends being dynamically configurable for carrier aggregation of contiguous and non-contiguous component carriers (CC), the method comprising:
obtaining measured or predicted data indicative of parameters of the radio frequency environment relating to capacity demand;
based on said measured or predicted data, selecting an operational mode from one of a plurality of modes, each mode specifying which antenna groups are enabled/disabled and specifying a mapping of component carriers to each enabled antenna group;
issuing instructions to RF front end circuitry to enable/disable one or more antenna groups, and providing a switch configuration for the software configurable switches of the isolation modules to route selected carrier components for RX and TX for each enabled antenna group, thereby dynamically mapping carrier components to antenna groups responsive to capacity demand.

For example, said measured or predicted data may comprise data relating to customer usage by time of day.

Selecting an operational mode based on said data may comprise execution of optimization functions by the network controller, after which configuration batches are sent to each small-cell for local enforcement, wherein the baseband processor translates the configuration that is sent to each RF Transceiver for dynamically configuring switches of the isolation modules.

Thus, systems, apparatus and methods are disclosed herein provide for improving or optimizing the present small-cell architecture by providing capacity that can be dynamically steered, to create a configurable coverage pattern that will adapt to location in such way to increase coverage and lower interference. In particular, a simple antenna system is disclosed which comprises small form factor multiple directional antenna groups that can be configured as a function of location, which is fed by an RF switching apparatus that allows dynamic routing of multiple component carriers to one antenna group or multiple antenna groups.

Embodiments of the antenna system architecture, apparatus and methods are applicable specifically to an intra-band non-contiguous carrier aggregation use-case where multiple carriers cannot be aggregated over the same RF transceiver but can be aggregated over an antenna group. Therefore, apparatus and methods of embodiments described herein are configurable to aggregate any two or more channels (component carriers), each driven to a specific RF transceiver, and dynamically map them to different antennas with a low loss and high efficiency.

Also provided is a computer program product embodied in a computer readable storage medium storing reported data and storing programming instructions for execution by one or more processing units of a radio access network comprising a plurality of base-station units with integrated multi-beam antennas and a centralized or distributed network controller, said programming instructions implementing, in one or more of said processing units, methods disclosed herein.

Thus, implementations of a multi-beam antenna system architecture, apparatus and methods are provided for dynamic carrier aggregation to multi-beam antenna mapping for improved capacity demand, using contiguous and non-contiguous component carriers. Embodiments are described which are particularly applicable to small-cell networks and have flexibility to adapt to any urban morphology, to improve or optimize cell coverage and user experience.

The foregoing and other objects, features, aspects and advantages of the present invention will become more apparent from the following detailed description, taken in conjunction with the accompanying drawings, of illustrative embodiments of the invention, which description is by way of example only.

DETAILED DESCRIPTION

Figure 1A:
FIG. 1A shows an aerial map view of a downtown urban area with a schematic overlay to show placement of small-cell sites of a radio access network, which illustrates some street level use-case scenarios for an urban network morphology.
Figure 1B:
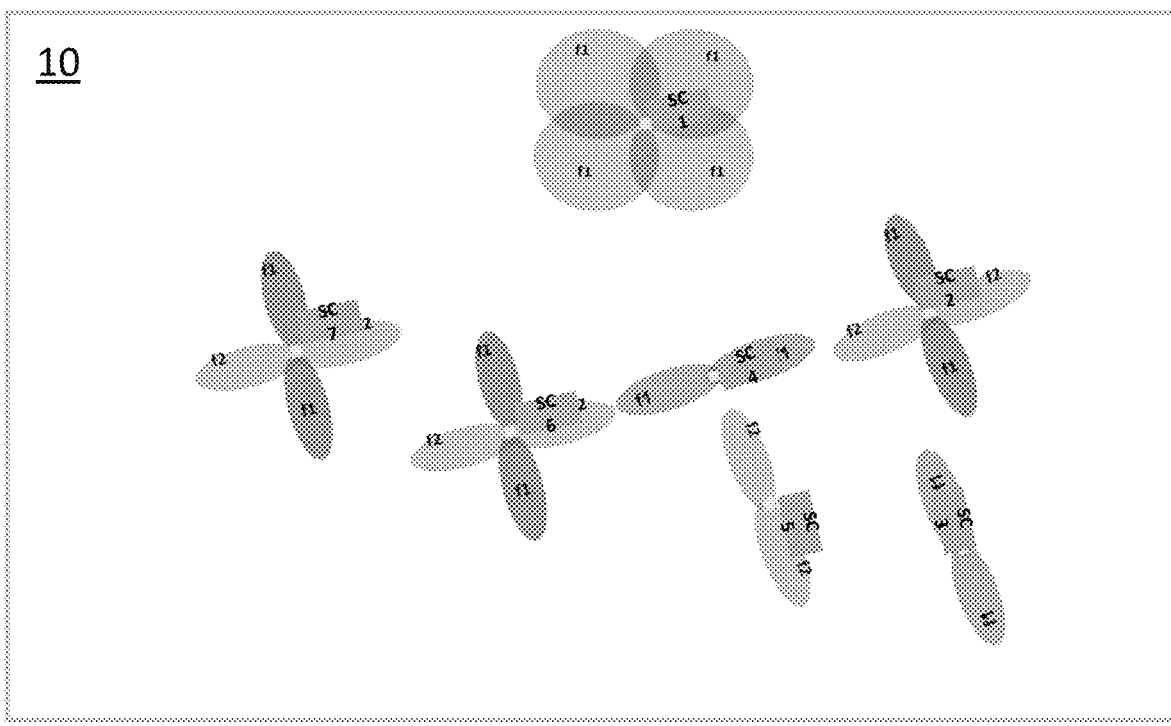
FIG. 1B shows the schematic overlay of FIG. 1A, with the underlying aerial map removed for clarity, to show placement of the small-cell sites of the radio access network and their directional antenna patterns.

FIG. 1A shows a schematic diagram of a radio access network comprising a plurality of small-cells deployed in a dense urban environment, overlaid on an aerial map view of the downtown urban area which it serves, to illustrate some street level use-case scenarios for an urban network morphology. In this map area, there is a downtown area having a network of streets arranged in a rectangular grid pattern, i.e. streets running in generally east-west directions intersecting streets running in generally north-south directions, in which there are many high-rise buildings. The upper right part of the map area includes low-rise residential areas, a park area and non-linear street patterns. For clarity, FIG. 1B shows the same schematic overlay of FIG. 1A, with the underlying aerial map removed, to show the locations of 7 small-cell sites of the radio access network, and antenna patterns for each small-cell site.

In a typical dense urban environment, some of the small-cell (SC) sites serve open areas, parks or plazas, or low rise residential neighbourhoods. Other small-cell sites are placed at street level locations near crossroads or intersections, or on streets running between tall buildings, creating a canyon effect. Thus, for example: small-cell sites SC3, SC4 and SC5 are located along streets with tall buildings, which create a canyon effect, and comprised directional antenna elements which are enabled to provide antenna patterns with bidirectional coverage aligned to the street; small-cell sites SC2, SC6 and SC7 are located at intersections of major streets and have directional antenna elements enabled to provide antenna patterns pointing in four directions; and small-cell site SC1 serves an open area with a park and a low-rise residential area and has a four directional antenna elements enabled providing an overlapping multi-directional antenna pattern; In this example, the small-cell deployment operates with a carrier overlay of two component carriers (CC), f1 and f2. That is, each antenna group operates with one of f1 or f2 as marked (i.e. f1 indicated by red antenna beams and f2 indicated by green antenna beams).

Figure 2:
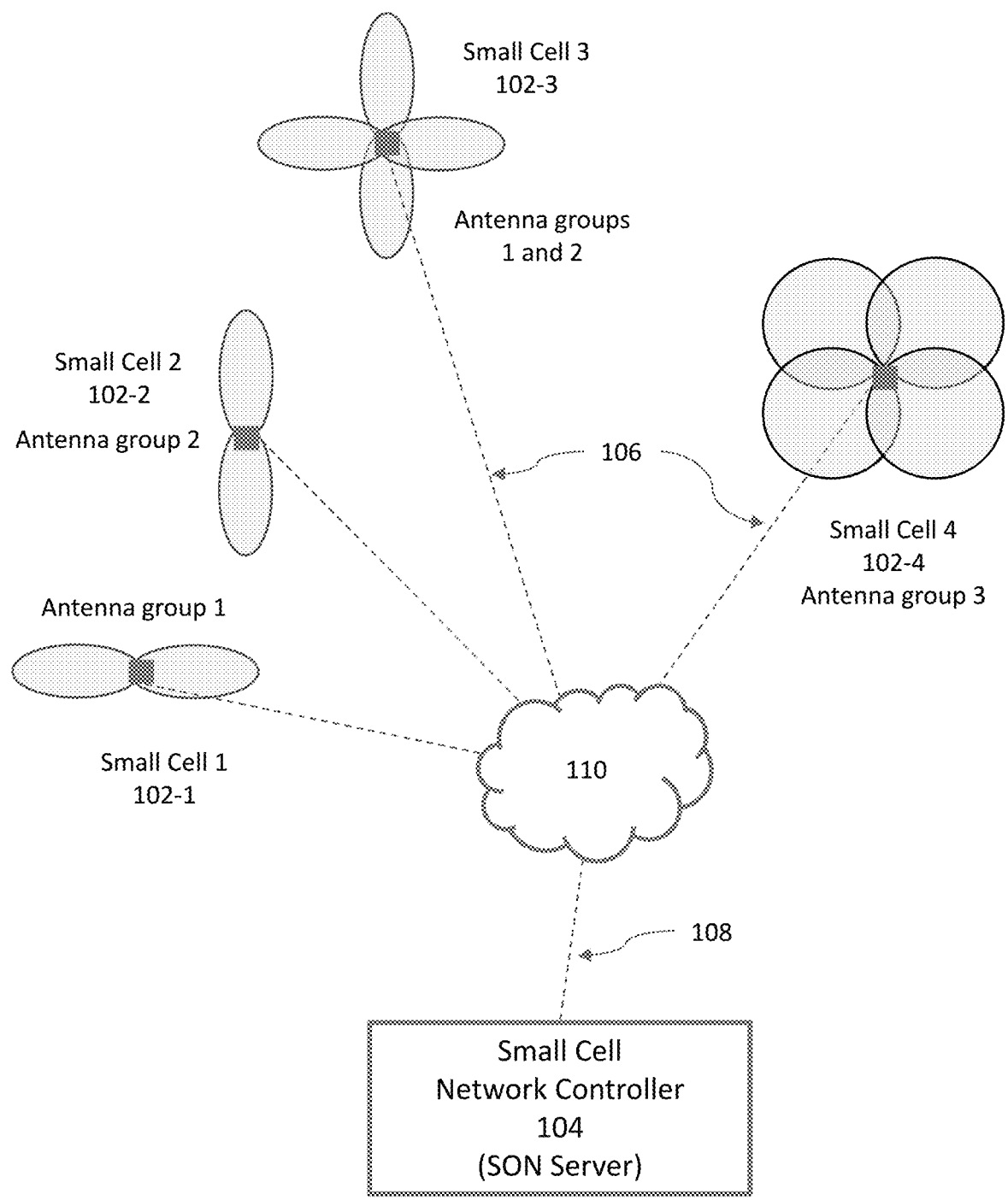
FIG. 2 shows a simplified schematic diagram representing part of a radio access network comprising a plurality of four small-cells and a network controller, wherein each small-cell base transceiver unit comprises a configurable multi-beam antenna system for implementing dynamic carrier aggregation according to an embodiment of the present invention.

FIG. 2 shows a simplified schematic diagram representing a radio access network of an embodiment comprising a plurality of small-cells 102-1, 102-2, 102-3 and 102-4, and a network controller 104, which may be a centralized or distributed Self Optimizing Network (SON) server, wherein each small-cell base transceiver unit comprises a configurable multi-beam antenna system for implementing a method of dynamic carrier aggregation to multi-beam antenna mapping according to an embodiment of the present invention. Each compact base transceiver unit comprises an integrated multi-beam antenna system including a plurality of antenna groups, and each antenna group comprises directional antenna elements, which are enable or disabled by software configurable switches for operation in a plurality of modes using only one antenna group or a plurality of two or more antenna groups to address different use-case scenarios, as illustrated schematically in FIG. 2. For example, the antenna system of small-cell 102-1 is configured to operate with a first antenna group (antenna group 1) comprising two directional antenna elements enabled, i.e. to provide bi-directional coverage, e.g. in east-west directions along a street. The antenna system of small-cell 102-2 is configured to operate with a second antenna group (antenna group 2) comprising two directional antenna elements enabled, i.e. to provide bi-directional coverage in an orthogonal direction, e.g. in north-south directions along a street. Small-cell 102-3 is configured to operate with both the first and second antenna groups (antenna groups 1 and 2) of antenna elements enabled to provide four-directional coverage, e.g. for installation at a street intersection. Small-cell 102-4 is configured to operate with a third antenna group (antenna group 3) comprising directional antenna elements with overlapping beams, to provide quasi-omnidirectional coverage, e.g. for an open area or plaza, or for a low-rise residential area. The directional antenna elements of the third antenna group provide coverage over a wider angle and fill nulls between the antenna coverage of the first and second groups of antenna elements. The multi-beam antenna system of each base transceiver unit is dynamically configurable to select one of more groups of antenna elements, i.e. one group, two groups or all three groups, to provide an appropriate antenna pattern at each small-cell location, dependent on use-case scenario, and to adapt to different network morphologies. As will be described in detail in the following paragraphs, the RF transceiver chains of each base transceiver unit can be enabled for dynamic carrier aggregation of multiple component carriers (CC) to multi-beam antenna mapping to address variability of capacity demand, e.g., by location and time of day (ToD). The component carriers may be contiguous or non-contiguous. Communication network 110 provides for data and control links 106, 108 with the SON server 104, for software configuration of the antenna groups and for implementation of dynamic carrier aggregation to multi-beam mapping for each transceiver unit.

Figure 3:
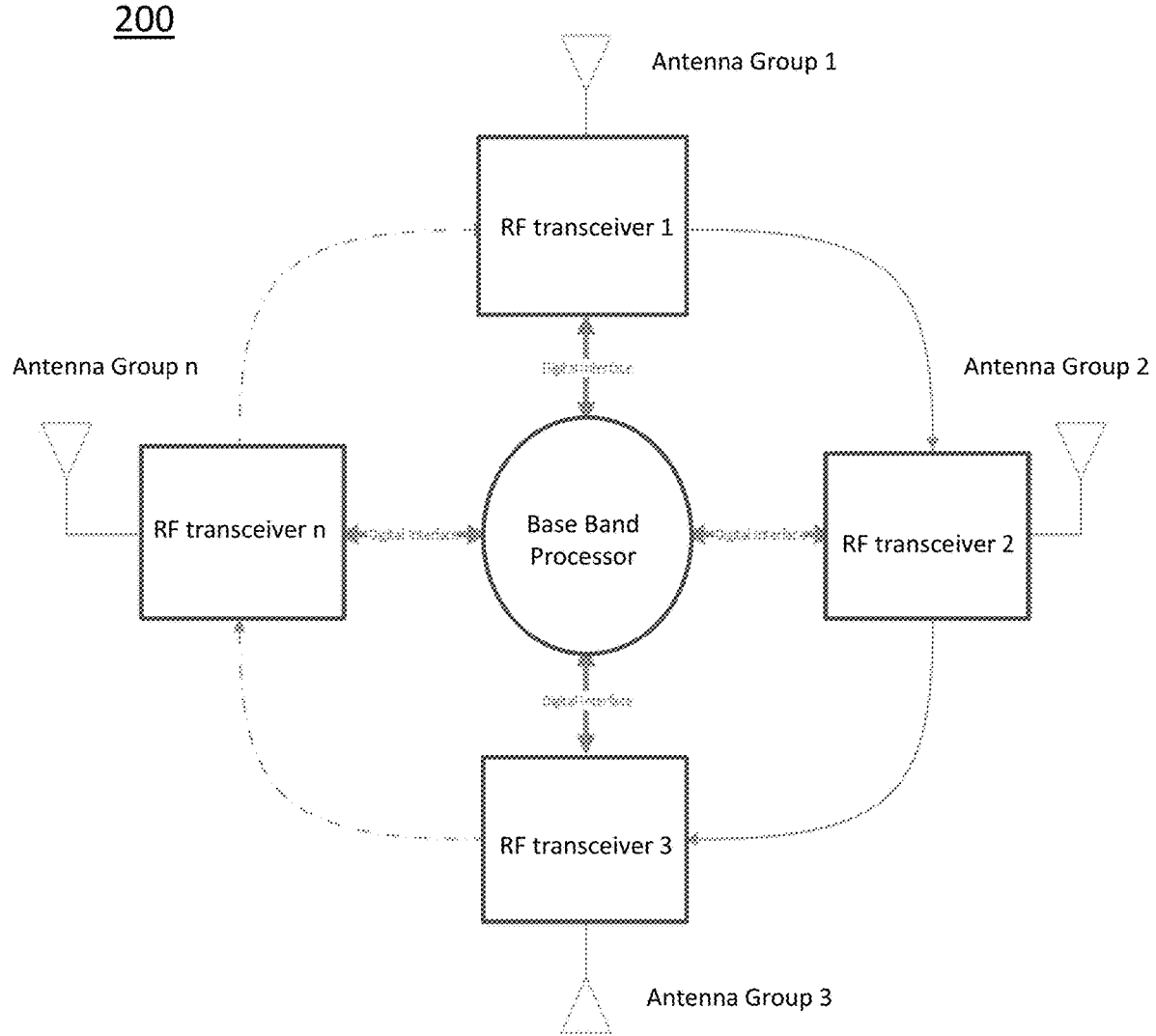
FIG. 3 shows a schematic diagram of components of a base transceiver unit and antenna system comprising a daisy-chained RF system architecture of a first embodiment.

A schematic diagram representing a hardware design of a base transceiver apparatus 200 for dynamic carrier aggregation is shown in FIG. 3. The base transceiver apparatus 200 comprises a daisy-chained radio frequency (RF) system wherein one baseband processor feeds multiple RF transceivers, and the RF transceivers are interlinked, through their RF front ends, so that each RF transceiver can be connected to one or multiple antenna groups. Each of the RF transceivers may carry one or multiple CC, as long as the transceiver bandwidth is not exceeded. This daisy-chained hardware design enables routing of each RF transceiver data stream, sequentially from one RF transceiver to the next around the daisy chain, for connection to any one of the antenna groups, for transmitting and receiving (TX/RX) using TDD (Time Division Duplexing).

Figure 4:
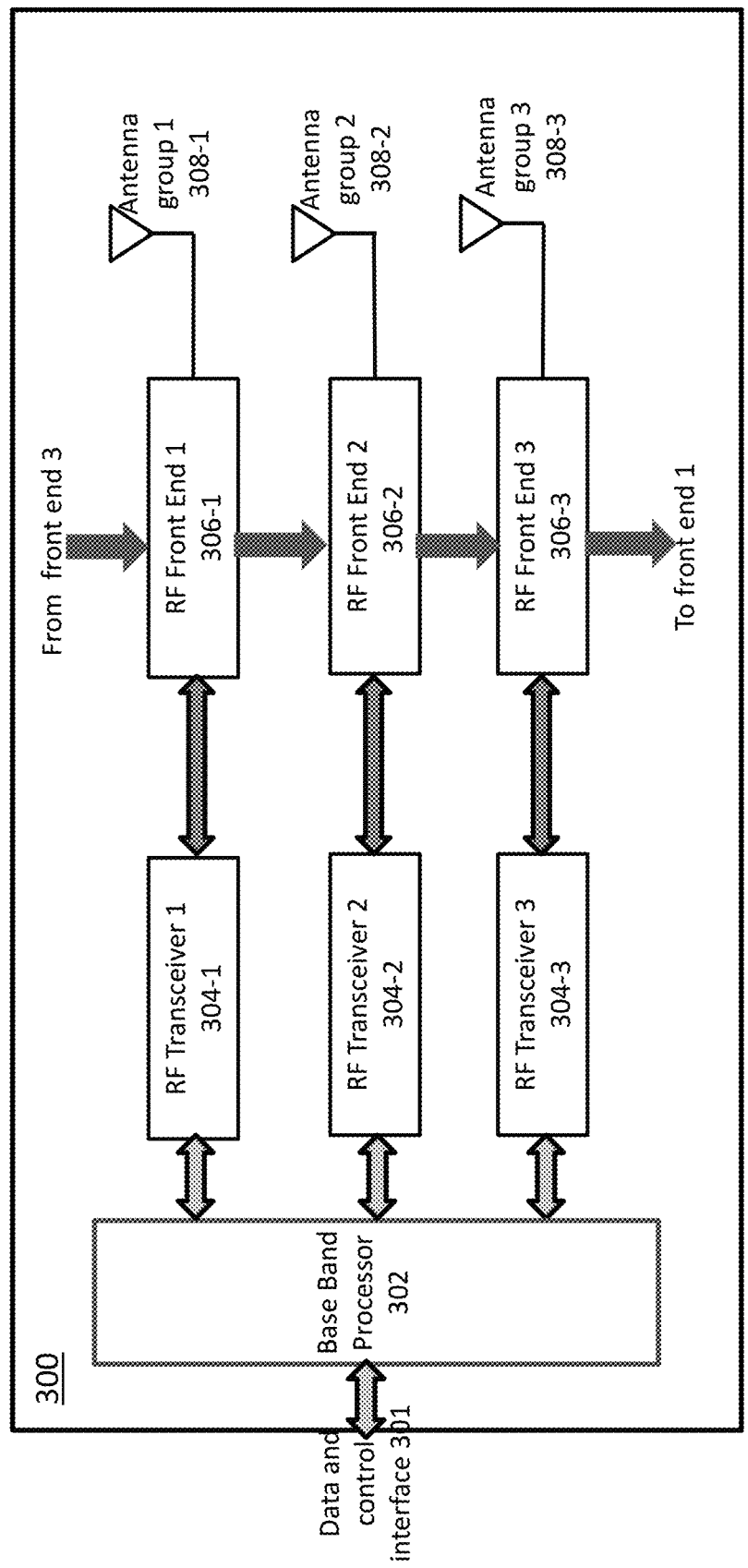
FIG. 4 shows a schematic diagram of a base transceiver unit and antenna system of an embodiment comprising a plurality of three RF chains and three antenna groups, each RF chain comprising an RF transceiver and an RF front end, each RF front end including isolation modules providing uni-directional links between RF front ends for implementing the daisy-chained RF system architecture for carrier aggregation.

For example, FIG. 4 shows a schematic diagram of a base transceiver unit 300 of an embodiment comprising a baseband processor and 3 RF chains, each RF chain comprising an RF transceiver 304, RF front end 306, and antenna group 308. Baseband processor 302 has a communications interface 301 for data and control signals, and digital interfaces which feed the three RF transceivers 304-1, 304-2 and 304-3. The three RF chains are linked in a daisy-chain configuration through the RF front ends, i.e. RF front end 306-1 is linked to RF front end 306-2, RF front end 306-2 is linked to RF front end 306-3, and RF front end 306-3 is linked back to RF front end 1. For transmission (TX), the RF front ends are dynamically configurable to enable the RF data stream from one or more of the three RF transceivers to be routed through the daisy-chain linkage of the RF Front ends to one or more of the three antenna groups 308-1, 308-2 and 308-3. Correspondingly, for reception (RX), the RF data streams from the antenna groups can be routed through the daisy-chain linkage of the RF front ends to any or each of the three RF transceivers.

This interlinking of multiple RF transceiver chains through the RF front ends enables implementation of dynamic aggregation of multiple contiguous or non-contiguous component carriers (CC) with flexibility to aggregate any CC regardless of where it is placed in the band, where the sum of aggregated bandwidth of each transceiver will cover entire band. As an example, in a practical application: if a frequency band has a bandwidth of 150 MHz, out of which any CC or combination of CCs can be deployed, the entire band can be covered by three RF transceivers, each having 50 MHz bandwidth. One specific example is the CBRS band, which is a shared licensed band with a total bandwidth of 150 MHz comprising 15 channels. A network operator may be allocated one or more different channels of the 15 channels, dependent on location. For example, in the greater Ottawa area, the channels allocated to the operator for downtown Ottawa may be different from the channels allocated to the same operator for neighbouring areas of Gatineau and Kanata. Thus, for example, by configuring RF transceiver 306-1 for channels 1 to 5, RF transceiver 306-2 for channels 6 to 10 and RF transceiver 306-3 for channels 11 to 15, carrier aggregation of any combination of contiguous and non-contiguous CC over the entire 150 MHz band can be accomplished.

More generally, this antenna system architecture and apparatus is scalable for operation with a plurality of N RF transceivers and N antenna groups. For example, as illustrated in more detail in the schematic diagram of FIG. 5, for an apparatus of an embodiment comprising a plurality of N RF transceivers, each RF chain comprises an RF transceiver and a RF Front end. Each RF front end comprises software configurable isolation modules to implement dynamic carrier aggregation to multi-beam antenna mapping. The transceiver front ends are interlinked through their isolation modules to enable routing of each RF transceiver data stream to any one of the antenna groups. Each isolation module is software configurable to provide dual functionality enabling: multi-sector operation wherein one CC maps to one antenna group; and carrier aggregation wherein multiple component carriers are mapped to one antenna group. Dual isolation blocks within each transceiver architecture facilitate low noise and self-interference resistant inter-transceiver connectivity and operation. As illustrated schematically in FIG. 5, for a base transceiver unit comprising a plurality of RF transceivers, e.g. N transceivers, the baseband processor 402 has a bidirectional digital interface to feed each of the N RF transceivers, i.e. n=1, 2 ... N. Each front end module comprises an isolation module having first and second isolation blocks 410-n and 412-n as illustrated schematically for the nth front end. The first isolation block 410-n is connected to link the n−1th front end to the nth front end, and the second isolation block 412-n is connected to link the nth front end to the n+1th front end, so that any TX/RX data stream can be selectively directed around the daisy chain to any one of the N antenna groups. To close the daisy chain loop, the Nth front end is linked to the $1^{st}$ front end. The front end circuitry TX/RF FEM 414-n of each transceiver front end n can be individually enabled or disabled to allow sharing of processing resources within the same hardware system. The software configurable dual isolation modules thereby provide flexibility for dynamic carrier aggregation, including intra-band contiguous aggregation, intra-band non-contiguous aggregation and inter-band non-contiguous aggregation. For example, for a licensed shared band, even if the service provider's CC allocation (i.e. specific channels) is not known in advance, the front-end circuitry of the system is dynamically software configurable to adapt to any combination of two or more CC within the band. Moreover, this system architecture also enables dynamic carrier aggregation to adapt to variability of capacity demand, e.g. by ToD or location.

Figure 6:
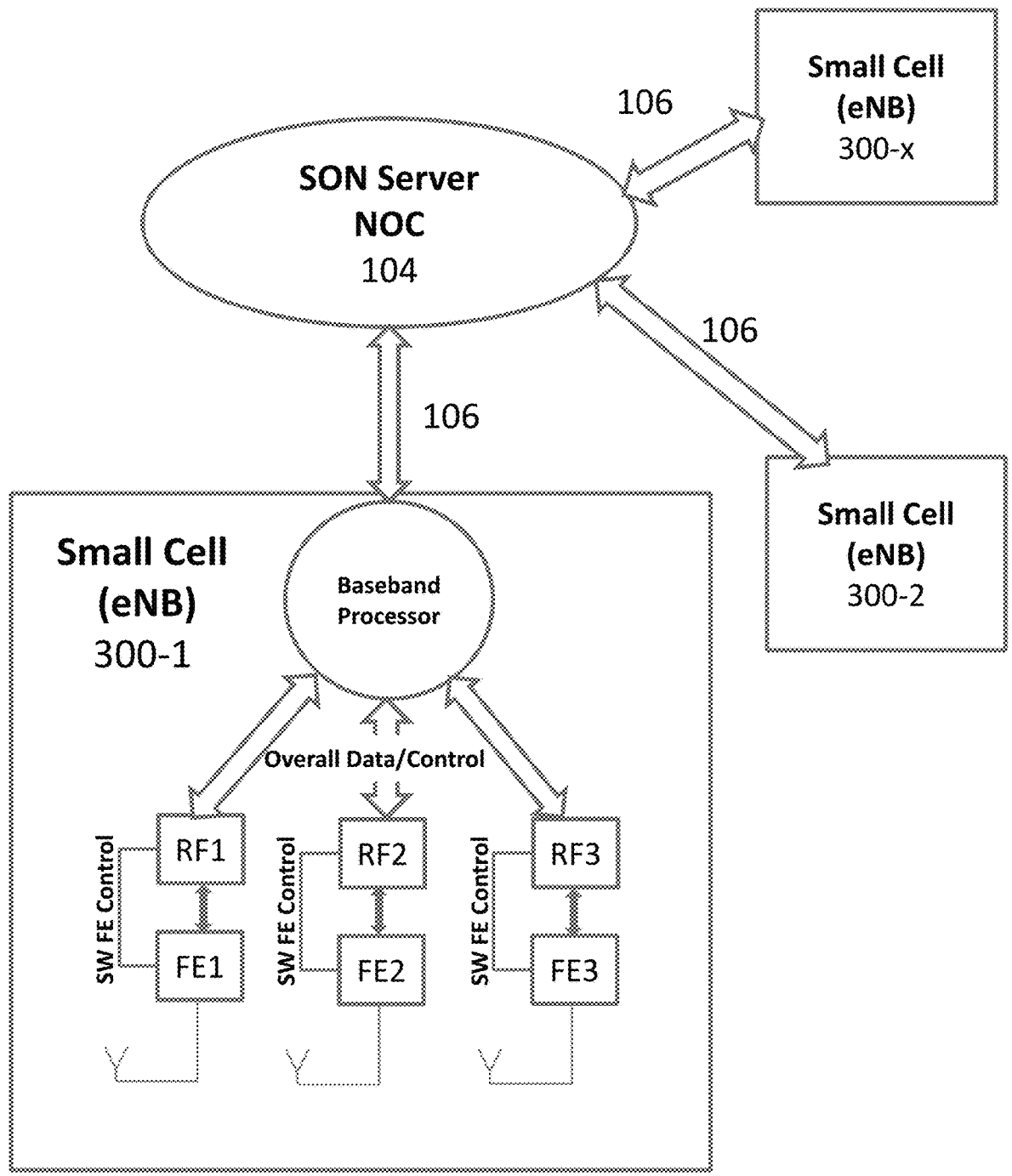
FIG. 6 shows a schematic diagram to illustrate control links for software configuration of the isolation modules of a base transceiver unit of the embodiment shown in FIG. 4 comprising 3 RF chains.

FIG. 6 shows a schematic diagram to illustrate control links for dynamic carrier aggregation to multi-beam antenna mapping in a small cell RAN wherein each small-cell (eNB) unit 300 is similar to that shown in FIG. 4 comprising one baseband processor, three RF chains and three antenna groups. The network controller 104 may be a distributed or centralized SON (Self Optimizing Network) server, e.g. a centralized server located at a Network Operations Centre (NOC), which provides control and data links 106 to the baseband processor of each small cell unit 300. As illustrated for eNB 300-1, the digital interface between the baseband processor and each RF Transceiver (RF1, RF2 and RF3) carries overall data and control information. For each RF chain, a software front end control link (SW FE Control) is provided from the RF transceiver RFn to the corresponding front end FEn (e.g. RF1 to FE1), for configuring the isolation module blocks of each front end, for routing of each RF data stream, so that for transmitting, any of the three RF TX data streams can be routed through the daisy-chain linking the RF front ends to one or more antenna groups, and for receiving, the RF RX data streams from any of the three antenna groups can be routed through the daisy-chain to any one of the three RF transceivers. For example, Network Level Optimization is computed by the SON Server and a configuration is communicated to each Small-cell (eNB). The baseband processor translates the configuration that is sent to each RF Transceiver. From each RF transceiver, by means of several GPIOs (General Purpose Inputs/Outputs), a combination of RF switches is configured accordingly within each corresponding isolation module, to route the RX and TX data streams using TDD.

Figure 5:
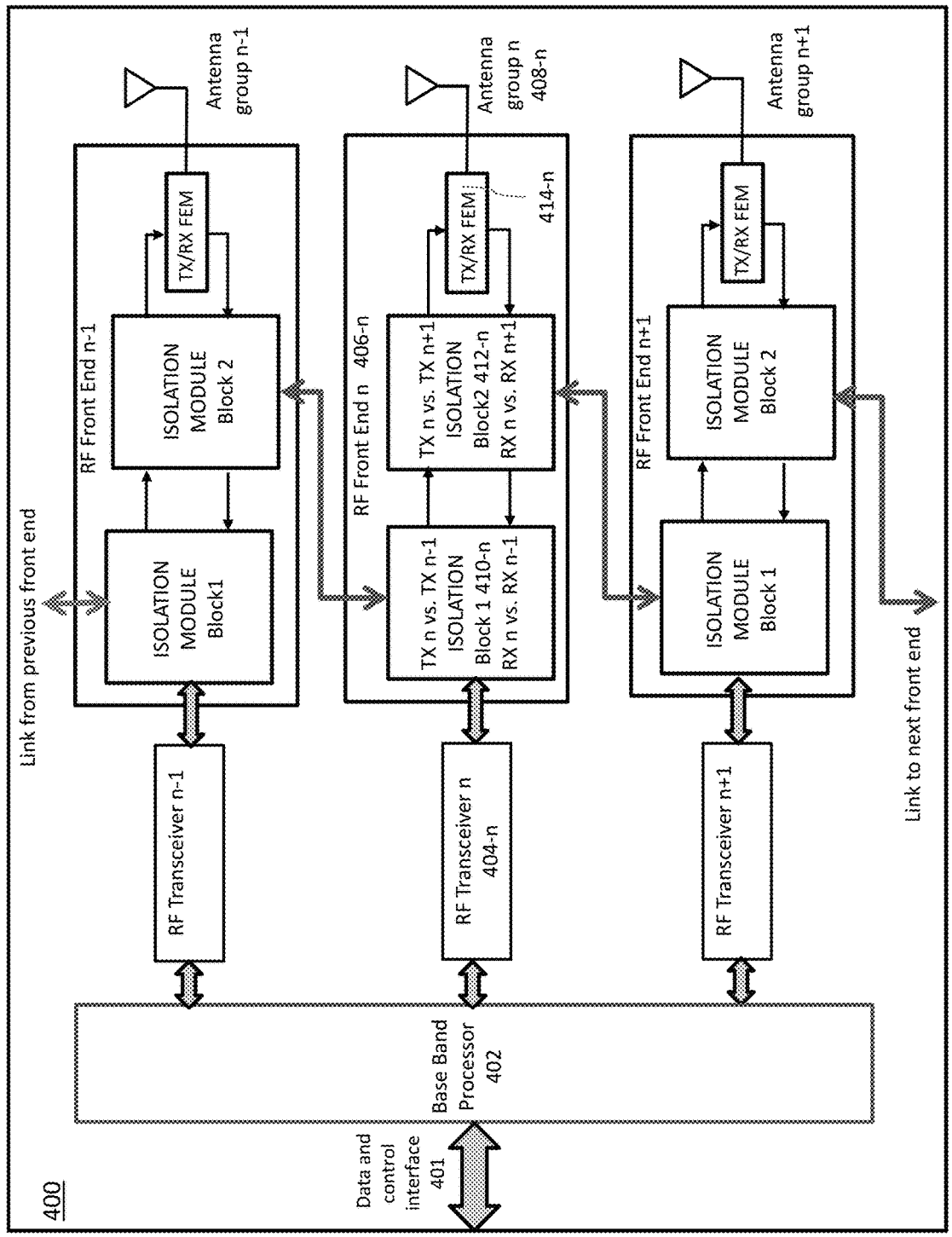
FIG. 5 shows a schematic diagram of a base transceiver unit and antenna system of another embodiment comprising a plurality of RF chains and antenna groups, each RF chain comprising an RF transceiver and an RF front end, each RF front end including isolation modules providing communication links between RF front ends for implementing the daisy-chained RF system architecture for carrier aggregation.
Figure 7:
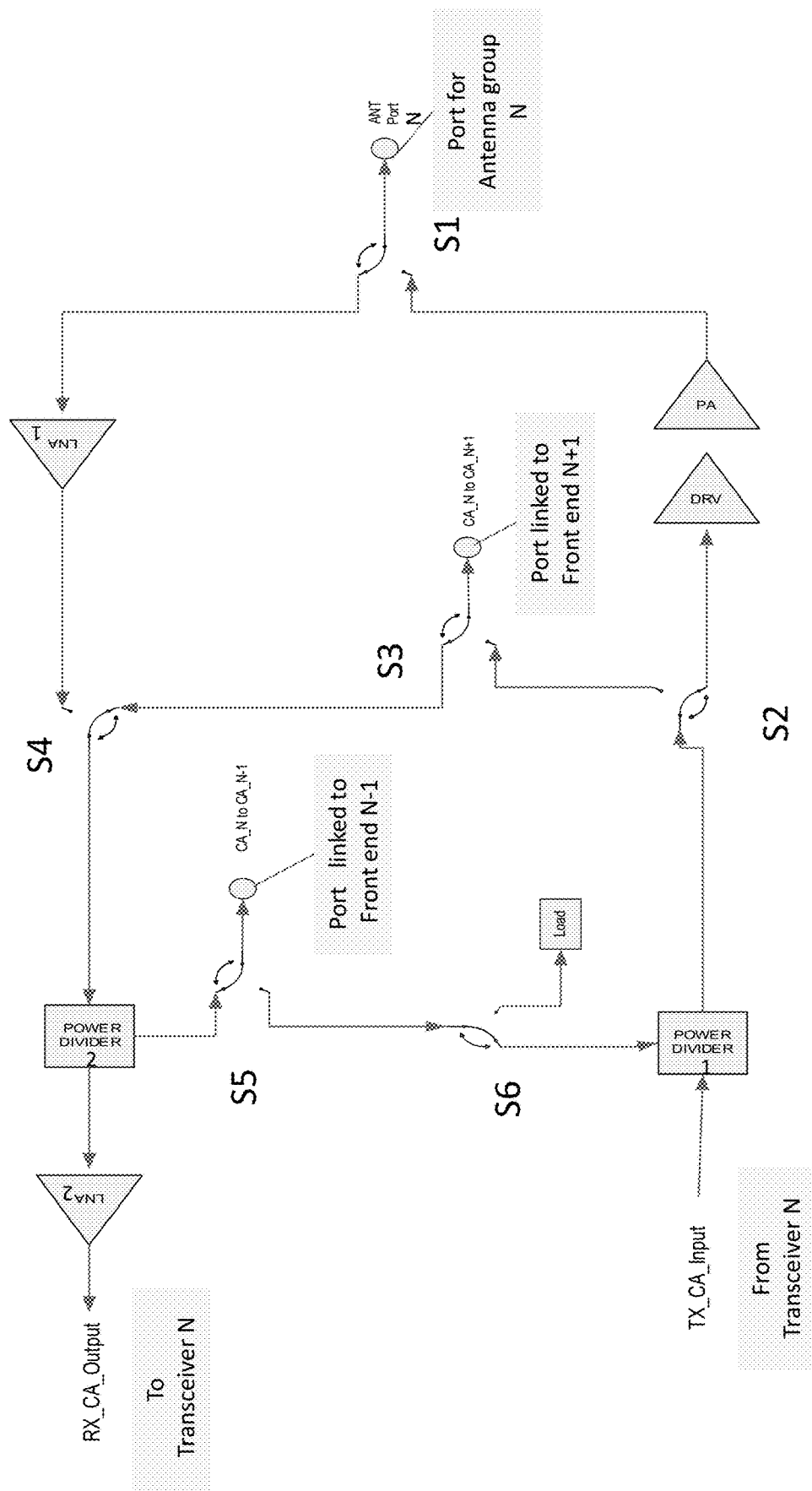
FIG. 7 shows a schematic circuit diagram of an illustrative embodiment of components of an RF front end N comprising a plurality of software controlled bi-directional switches for implementing the functionality of the isolation modules shown in FIG. 5 for routing transmit TX and receive RX signals to/from RF front end N−1 and RF front end N+1.

FIG. 7 shows a schematic circuit diagram of components of an RF front end N of an illustrative embodiment comprising a plurality of software controlled bi-directional switches S1, S2, S3, S4, S5 and S6; switch S1 is used to connect RF front end N to antenna port N for antenna group N; switches S2, S3 S4, S5 and S6 are used for implementing the functionality of the isolation modules, as illustrated schematically in FIG. 5, to route transmit and receive signals (RX/TX) between RF front end N and RF front ends N−1 and N+1, using TDD. The RF front end N comprises an input port for transmit signal (TX_CA_Input) from RF transceiver N and an output port for receive signal (RX_CA_Output) to RF transceiver N. There is also a port which is connected to RF Front end N−1 (CA_N to CA_N−1) and a port which is connected to RF front end N+1 (CA_N to CA_N+1), and an antenna port (ANT Port). The antenna port (ANT Port N) for antenna group N is connected to the TX and RX signal paths by bidirectional switch S1. In transmission mode, the TX_CA_Input from Transceiver N is input through power divider 1 and may be routed by software controlled bi-directional switch S2 through driver DRV and power amplifier PA and antenna switch S1 to antenna port ANT Port N. Alternatively, switch S2 may be configured to route the TX_CA_Input from Transceiver N to switch S3 to route TX_CA_Input to the output port CA_N to CA_N+1, thereby routing this signal to RF Front End N+1. A transmit signal may also be received from RF Front end N−1 and routed through switches S5 and S6 to power divider 1 and then routed through switch S2 and S1 to antenna group N through ANT Port N, or routed through switches S2 and S3 to Front End N+1. Thus, in transmission mode, the input signal from RF transceiver N can be routed through the daisy-chain connections linking each of the RF front end, with flexibility to route the RF data stream, sequentially through the RF Front end isolation blocks, as required, e.g. to the Nth antenna group, to one of the other antenna groups, to all antenna groups, and to two or more antenna groups. Correspondingly, in reception mode, the RF data stream from antenna group N received at antenna port ANT Port N is routed by switch S1 through low noise amplifier LNA1 and may then be routed through switch S4, power divider 2, and low noise amplifier LNA2 to provide output RX_CA_Output to RF transceiver N. Alternatively, switch S4 may be configured to route the RF data stream from antenna group N+1 through power divider 2 and switch S5 to the port linked to Front end N−1. A RX data stream received from the port linked to RF Front end N+1 may be routed through switch S4 to power divider 2 to RF Front end N and at the same time through switch S5 to the port to RF Front end N−1. As explained with reference to the schematic diagram shown in FIG. 6, software configuration of the switches S1 to S6 of each RF Front End module is implemented by control signals received through control links from the network controller (which may be a SON server) and the SW FE control link between each RF Front transceiver and its RF front End. For example, switches of each RF Front end may be configured to route the RF data stream uni-directionally through the daisy-chain, e.g. from Front end N−1 to Front end N to Front end N+1, or to route the data stream from RF Front end N to ports to both Front end N−1 and Front end N+1. Each switch implements a certain isolation level, each isolation module being connected to the previous front end (N−1) and the next front end (N+1) (CA_N→CA_N−1 & CA-N→CA_N+1). This daisy-chain hardware design comprising isolation blocks with software configurable switches enables routing of multiple CCs for carrier overlay and for carrier aggregation, with flexibility for dynamic carrier aggregation, with mapping to one or multiple antenna groups.

In contrast, in conventional prior art systems that rely on switching matrices, diplexers, multiplexers and filters for signal combining and antenna selection, carrier aggregation is limited by the particular diplexer and filter design implementation. For example, if a service provider or network operator is using two licensed CCs, these must be known in advance so that components such as filters can be selected accordingly for the particular CC allocation. Thus, known solutions that can provide carrier aggregation of multiple contiguous or non-contiguous CCs over a wider bandwidth require much more complex switching matrices and filter combinations to cover all possible CC combinations for carrier aggregation to antenna mapping.

A practical example of operation of a small cell transceiver unit comprising a multi-beam antenna system according to an embodiment will now be described with reference to FIG. 8, which shows a schematic diagram representing a multi-beam antenna system comprising three daisy-chained RF transceivers, which enables a method for dynamic carrier aggregation wherein the capacity of multiple component carriers (CC) is mapped dynamically to the multi-beam antenna system. Software configurable mapping of one CC or multiple CCs to one or more antenna beams creates a dynamically configurable small-cell BTS that can adapt to different urban morphologies and user distributions, and which can be dynamically configured to adapt to variability of capacity demand, e.g. by ToD. FIG. 9 shows a schematic diagram representing modes of operation of the multi-beam antenna system of FIG. 8, for some use-case scenarios typical of an urban network morphology.

Figure 8:
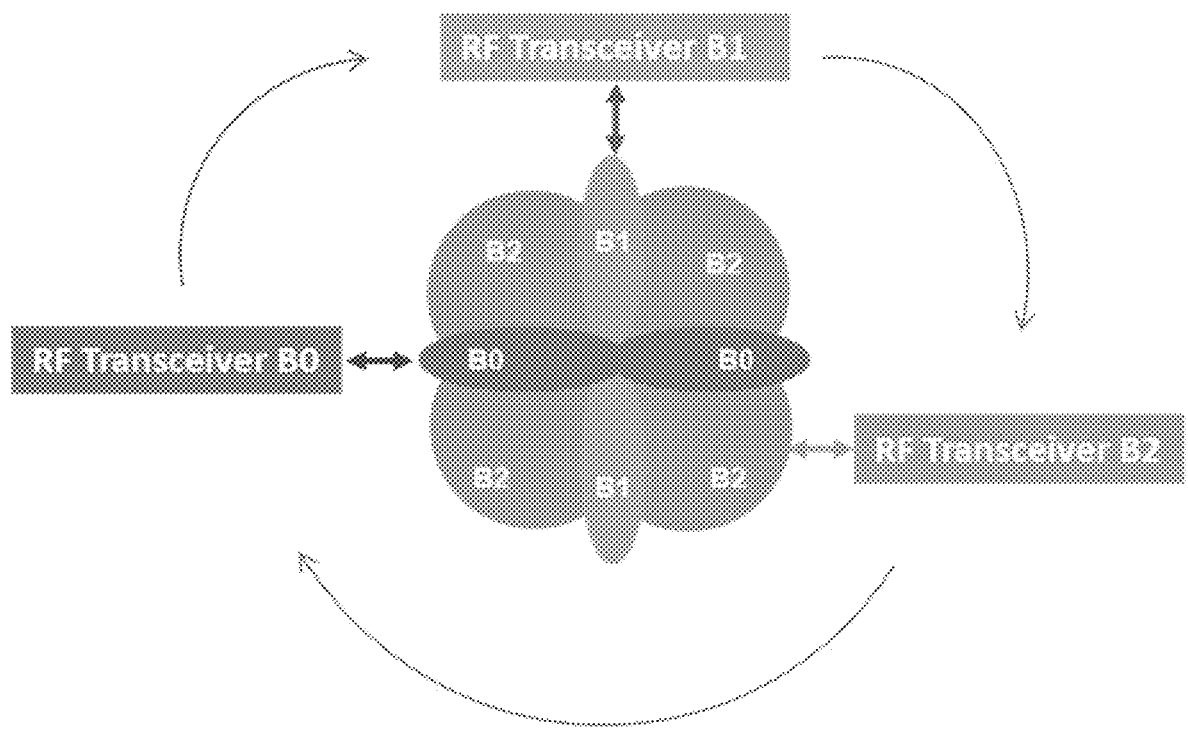
FIG. 8 shows a schematic diagram representing a multi-beam antenna system comprising three daisy-chained RF transceivers.
Figure 9:
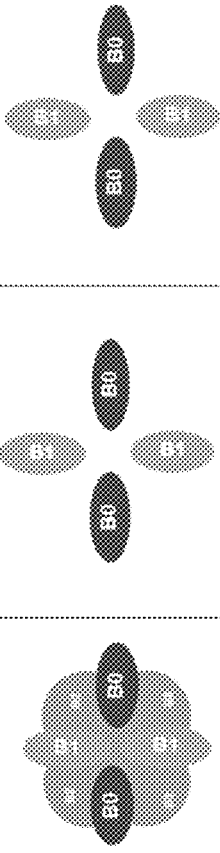
FIG. 9 shows a schematic diagram representing modes of operation of the multi-beam antenna system of FIG. 8 for some use-case scenarios typical of an urban network morphology.

As illustrated in FIG. 8, the multi-beam antenna system of this embodiment comprises three antenna groups B0, B1 and B2, and correspondingly, three RF transceivers B0, B1 and B2. The Front Ends of the RF transceivers B0, B1 and B2 are connected in daisy-chain configuration, for example, as explained for the apparatus of the embodiments shown in FIGS. 4 and 5. For example, each RF Front end may comprise isolation modules such as described with reference to FIGS. 5 and 7. In principle, each individual antenna group B0 or B1 or B2, any two antenna groups (B0 and B1, B0 and B2, or B1 and B2), or all three antenna groups (B0, B1 and B2) can be selectively and dynamically enabled/disabled. In the case that only some of the antenna groups are enabled, then the component carrier CC physically linked to a disabled antenna can be routed to next operational (enabled) antenna. As mentioned above, conventionally, small-cells use omnidirectional or quasi omnidirectional antenna architectures. For an antenna system architecture as illustrated schematically in FIG. 8, operation with directional antenna groups B0 or B1 provides directivity and higher gain to produce much stronger coverage and user experience, e.g. for a location along a street. Operation with both directional antenna groups B0 and B1 provides directional coverage in orthogonal directions, e.g. suitable for location at an intersection, or a plaza surrounded by buildings. When installed in open areas such as suburban low-rise residential areas and plazas, the small cell may be operated with all three antenna groups. Antenna groups B0 and B1 are strongly directional antennas while antenna group B2 fills in the nulls between B0 and B1, so that operation with all antenna groups B0, B1 and B2 covers nulls and produces high gain peaks to extend footprint coverage. Additionally, carrier aggregation can be applied to map one CC or multiple CCs to any one antenna group or to multiple antenna groups, as described above. For the multi-beam antenna system architecture shown in FIG. 8, some examples of different modes of operation and carrier aggregation for some different street level use-case scenarios are illustrated schematically in FIGS. 1A and 1B, 2 and 9.

Referring to FIG. 9, for use-case 1, 1, e.g. locations at intersections or in plazas surrounded by buildings, in a first mode of operation, there is an overlay of three carrier components f0, f1 and f2 and all three antenna groups B0, B1 and B2 are operational. That is, a carrier overlay means that each antenna group uses a different component carrier f0, f1 and f2, respectively. For use case 1, 2, in the second mode of operation antenna group B0 operates with f0 and B1 operates with f1 to provide directional coverage, and antenna group B2 is disabled. For use case 1, 3, in a third mode of operation, B0 operates with aggregation of two component carriers f0 and f2 for increased capacity in the east-west direction, while B1 operates with one component carrier f1. In use-case scenario 2 for a canyon scenario, such as a street level location where the street runs between taller buildings, one of the directional antenna groups may be operated with all three component carriers in carrier aggregation, i.e. f0, f1 and f2 are mapped to antenna group B1 for north-south coverage (use case 2, 2) or to B2 for east-west coverage (use case 2, 3). In another example, two component carriers f0 and f2 are mapped to B1 for strong north south coverage and f2 is mapped to antenna group B2 to provide more distributed coverage and fill in nulls around B1 (use case 2, 1). In use-case scenario 3, for residential open space in suburban areas or larger open areas, in one example B2 is operated with carrier aggregation of 3 CC, f1, f2, f3 to provide quasi-omnidirectional capacity (use case 3, 1) or each antenna group B0, B1 and B2 is operated on a different component carrier (use case 3, 2). Other examples of carrier overlay of two CC, f1 and f2, are shown in the small cell network configuration illustrated in FIGS. 1A and 1B. Thus, the mode of operation of the multi-beam antenna system can be configured as a function of location and interference situation, and the system can also operate with fractional frequency re-use.

Note that there is a distinction between carrier aggregation and carrier overlay. Carrier overlay is transmission of two or more independent carriers over one or multiple antenna groups. One user equipment (UE) would connect to one of the independent carriers. Carrier aggregation (CA) is transmission of two or more independent carriers with one being called the anchor carrier. The anchor carrier is the carrier to which any UE connects. The anchor carrier must have the ability to blanket the entire carrier aggregation schema. The advantage of carrier aggregation is that one UE can simultaneously receive one or all aggregated carriers. Carrier aggregation increases throughput to each UE. Overlay is typically used when the density of users is high and each carrier has different coverage areas (even if overlap is high). For instance, in FIG. 9, use-case 1, 1 is an overlay. This configuration can also provide CA but then coverage area for CA would be limited to one of f0→B0, f1→B1 or f2→B2 because one of f0, f1 and f2 must be the anchor CC. A UE can first connect/attach only to the anchor CC, and it must be connected to the anchor CC before it can receive another CC.

As illustrated schematically in FIG. 5, the configurable multi-beam antenna system and RF system architecture disclosed herein is scalable for N RF chains, and for multiple contiguous CCs or non-contiguous CCs. Carrier aggregation may comprise, for example aggregating two or more LTE carrier components, not necessarily contiguous, to transmit more resource blocks, e.g. up to 5 carrier components with a band width of up to 20 MHz, for a combined bandwidth of 100 MHz. More generally, embodiments of the antenna system architecture, apparatus and methods are applicable specifically to an intra-band non-contiguous carrier aggregation use-case where multiple carriers cover e.g. a band wider than 100 MHz, and cannot be aggregated over the same RF transceiver but they can be aggregated over the same antenna that can cover, for example, up to 400 MHz of spectrum. As mentioned above, one practical example is CBRS band (Citizens Broadband Radio System band) where the entire band is 150 MHz wide and a SAS (Spectrum Access System) can dynamically allocate to an operator multiple 10 or 20 MHz channels all over the 150 MHz of the band. In another example, carrier aggregation may comprise out of band carrier aggregation of component carriers in the 3 GHz and 5 GHz bands. For example, in the 5 GHz band, the antenna may have a bandwidth of up to 700 MHz. Therefore, apparatus and methods of embodiments described herein may be configured to aggregate any two or more channels (component carriers) over the entire band or different bands and dynamically map the capacity of one CC or multiple CCs to different groups of antennas with a minimum loss and maximum efficiency.

The use of RF Front Ends with isolation modules for carrier aggregation, as disclosed herein, provides a simple solution that avoids the limitations of existing solutions for carrier aggregation using switching matrices with diplexers and filters which must be pre-configured for operation at specific predetermined frequencies. The latter are appropriate where operator licenses two or more specific channels/CC and can pre-configure the system to operate specifically on those licensed bands.

In addition to enabling flexibility of CA of any two or more CC, the daisy chain RF transceiver and antenna system architecture is software configurable to dynamically adapt to capacity demand, e.g. to provide increased cell coverage and improved user experience, and to adapt for any type of network morphology typically encountered in urban, suburban and rural areas. Thus, the system, apparatus and methods described herein are particularly suitable for small-cell deployments, e.g. to fill gaps in macro-cell coverage, to enhance coverage in high demand locations and to adapt to variability in capacity demand by location and time of day. Use of software configurable isolation modules provides a compact and flexible solution to enable carrier aggregation to multi-beam antenna mapping. For example, the entire system may be implemented with the baseband processor, RF transceivers, RF front ends with isolation modules and antennas integrated within a small form factor, e.g. within a small enclosure or housing, to provide a compact basestation unit with integrated antenna, suitable for mounting unobtrusively on existing street infrastructure, and including lightweight hardware modules suitable for strand mounting.

The antenna system architecture of embodiments described herein is particularly suited for small-cell deployments, in the form of a compact all-in-one base transceiver unit with integrated antenna. In other embodiments, the software configurable transceiver and antenna system architecture may more generally applicable for dynamic carrier aggregation to multi-beam antenna mapping in large-cell and macro-cell deployments where more flexibility to adapt to variability of capacity demand is required.

Embodiments of the antenna system architecture, apparatus and methods disclosed herein are remotely and dynamically configurable to adapt to the radio frequency environment to maximize capacity and performance. For example, control functions for implementing methods for dynamic carrier aggregation and enabling/disabling selected antenna groups as disclosed herein may be implemented remotely via a network controller, e.g. a centralized or distributed SON server, as part of network operations and management functions.

There are many strategies and methods that can be enabled for operation of a large small-cell network comprising systems, apparatus and methods of embodiments of the present invention described herein. Typically, these will depend on operator strategy to serve customers, e.g. to provide a specific quality of service or customer experience, and to adjust to variations in capacity demand by time of day. The network can be configured dynamically based on predetermined customer usage patterns, or based on real-time network feedback. For example, based on field data and predictions, the server/network controller profiles different configurations as a function of use-cases and demand. After optimization functions are executed by the network controller, configuration batches are sent to each small-cell (eNB) and enforced locally. For example, Network Level Optimization is computed by the SON Server and communicated to each small-cell (eNB). The baseband processor translates the configuration that is sent to each RF Transceiver. From each RF transceiver by means of several GPIOs (General Purpose Inputs/Outputs) a combination of RF switches is configured accordingly within each corresponding isolation module.

Embodiments of a multi-beam antenna system and an apparatus and method for dynamic carrier aggregation to multi-beam antenna mapping in a radio access network are disclosed, having particular application to small-cell deployments. The apparatus comprises a compact base transceiver unit with an integrated multi-beam antenna comprising antenna groups which are software configurable for operation in a plurality of modes with one or more selected antenna groups enabled to address different use-case scenarios. The base transceiver unit comprises a daisy-chained radio frequency (RF) system wherein one baseband processor feeds multiple RF transceivers; each RF transceiver front end comprises a software configurable isolation module through which each RF front end is interlinked to the previous and next RF front ends to enable dynamic routing of TX/RX data streams through the daisy chain, e.g. routing a transmission data stream from any RF transceiver to any one of the antenna groups or multiple antenna groups, routing a received data stream from one or multiple antenna groups to any RF transceiver, enabling contiguous or non-contiguous carrier aggregation. Interlinking of RF front ends in a daisy chain configuration provides for a simplified switching arrangement which is dynamically configurable to enable routing of RF data streams around the daisy chain, with flexibility for operation with any combination or one CC or multiple CC. Systems, apparatus and methods are disclosed herein provide for improving or optimizing the existing small-cell architecture by providing capacity that can be dynamically steered, to create a configurable coverage pattern that will adapt to location in such way to increase coverage and lower interference. In particular, a simple multi-beam antenna system is disclosed which comprises small form factor multiple directional antenna groups that can be configured as a function of location, augmented by a lossless RF switching apparatus that allows dynamic routing of multiple component carriers on any of the beams.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. An apparatus for dynamic carrier aggregation to antenna mapping in a radio access network comprising:
a baseband processor having a communication interface for data and control signals;
a plurality of radio-frequency (RF) transceivers which collectively provide bandwidth for operation with multiple contiguous and non-contiguous component carriers (CC) of at least one spectral band;
the baseband processor serving each of the plurality of RF transceivers through respective digital interfaces;
a plurality of RF front ends;
a plurality of antenna groups each comprising a plurality of directional antenna elements;
each RF transceiver having an interconnection with a single one of the plurality of RF front end;
each RF front end having an antenna port with an interconnection to a respective one of the plurality of antenna groups; and
the plurality of RF front ends being interconnected in a daisy chain configuration wherein, for N being an integer greater than 1, RF front end N has an interconnection with RF front end N−1 and an interconnection with RF front end N+1;
said interconnections between the RF front ends in the daisy chain and the interconnections between each RF front end and the respective one of the plurality of antenna groups being dynamically configurable to enable an RF data stream from each of the RF transceivers to be routed through the daisy chain to any one of the antenna groups or to multiple antenna groups, and to enable an RF data stream from each of the antenna groups to be routed through the daisy chain to any one of the RF transceivers.

2. The apparatus of claim 1, wherein each RF front end comprises front end circuitry including a software configurable switch for enabling and disabling said antenna group connected to its antenna port, thereby enabling operation with any one of the plurality of antenna groups individually and operation with any combination of one, two or more of the plurality of antenna groups responsive to use-case scenario and capacity demand.

3. The apparatus of claim 1, wherein a first antenna group provides a first directional coverage, and a second antenna group provides a second directional coverage which is orthogonal to coverage of the first antenna group, switches of the front end modules being configurable to enable/disable the first and second antenna groups for dynamically operating one or both antenna groups to adapt to different use-case scenarios and capacity demand.

4. The apparatus of claim 1, wherein the baseband processor, and the plurality of RF transceivers and the plurality of antenna groups are integrated within a single enclosure.

5. The apparatus of claim 3, further comprising a third antenna group that provides coverage filling nulls between said first and second antenna groups, and wherein said switches of the front end modules configurable to enable/disable any one of the first, second and third antenna groups, for dynamically operating any one of the first, second and third antenna groups and any combination of first, second and third antenna groups, to adapt to different use-case scenarios and capacity demand.

6. The apparatus of claim 5, wherein the plurality of antenna groups consists of three antenna groups, antenna group B0 comprising a first set of directional antenna elements providing bi-directional coverage; antenna group B1 comprises a second set of directional antenna elements providing bi-directional coverage orthogonal to the first set of directional antenna elements; and antenna group B2 comprises a third set of directional antenna elements filling nulls of antenna groups B0 and B2.

7. An apparatus for dynamic carrier aggregation to antenna mapping in a radio access network comprising:
a baseband processor having a communication interface for data and control signals;
a plurality of radio-frequency (RF) transceivers which collectively provide bandwidth for operation with multiple contiguous and non-contiguous component carriers (CC) of at least one spectral band;
the baseband processor serving each of the plurality of RF transceivers through respective digital interfaces;
a plurality of RF front ends;
a plurality of antenna groups each comprising a plurality of directional antenna elements;
each RF transceiver having an interconnection with a single one of the plurality of RF front ends;
each RF front end having an antenna port with an interconnection to a respective one of the plurality of antenna groups; and
the plurality of RF front ends being interconnected in a daisy chain configuration wherein, for N being an integer greater than 1, RF front end N has an interconnection with RF front end N−1 and an interconnection with RF front end N+1, and an interconnection between a last RF front end in the daisy chain and a first RF front end 1 to form a daisy chain loop;
said interconnections between the RF front ends in the daisy chain loop and the interconnections between each RF front end and the respective one of the plurality of antenna groups being dynamically configurable to enable an RF data stream from each of the N RF transceivers to be routed through the daisy chain loop to any one of the antenna groups or to multiple antenna groups, and to enable an RF data stream from each of the antenna groups to be routed through the daisy chain to any one of the RF transceivers.

8. An apparatus for dynamic carrier aggregation to antenna mapping in a radio access network comprising:
a baseband processor having a communication interface for data and control signals;
a plurality of radio-frequency (RF) transceivers which collectively provide bandwidth for operation with multiple contiguous and non-contiguous component carriers (CC) of at least one spectral band;
the baseband processor serving each of the plurality of RF transceivers through respective digital interfaces;
a plurality of RF front ends;
a plurality of antenna groups each comprising a plurality of directional antenna elements;
each RF transceiver having an interconnection with a single one of the plurality of RF front ends;
each RF front end having an antenna port with an interconnection to a respective one of the plurality of antenna groups; and
the plurality of RF front ends being interconnected in a daisy chain configuration wherein, for N being an integer greater than 1, RF front end N has an interconnection with RF front end N−1 and an interconnection with RF front end N+1;

wherein each RF front end comprises an isolation module, and wherein said interconnections between RF front end N and RF front end N−1 and between RF front end N and RF front end N+1 are made through the isolation module of RF front end N, each isolation module comprising a plurality of software configurable switches for dynamically configuring routing of a transmit (TX) data stream from each RF transceiver to one or multiple antenna groups and routing of a receive (RX) data stream from each antenna group to any one of the RF transceivers.

9. The apparatus of claim 8, wherein said software configurable switches comprise an arrangement of software configurable bidirectional switches.

10. The apparatus of claim 8, wherein for operation with a plurality of component carriers (CC), the isolation modules are configurable to enable carrier overlay and to enable carrier aggregation, wherein carrier aggregation comprises intra-band contiguous, intra-band non-contiguous and inter-band non-contiguous carrier aggregation.

11. The apparatus of claim 8, wherein said interconnections comprise an interconnection the isolation module of a last RF front end in the daisy chain and the isolation module of a first RF front end 1, to form a closed-loop daisy chain.

12. The apparatus of claim 10, wherein for operation with a plurality of component carriers (CC) of the Citizens Broadband Radio System (CBRS) band, each of the N plurality of RF transceivers has a bandwidth covering part of the 150 MHz of the CBRS band, to collectively cover the entire CBRS band, and enable carrier aggregation of any combination of contiguous or non-contiguous CC of the CBRS band.

13. The apparatus of claim 12, wherein the plurality of RF transceivers is a set of 3 RF transceivers each having a bandwidth of 50 MHz, the plurality of antenna groups is a set of three antenna groups, and wherein switch configurations of the isolations modules provide for multiple modes of operation responsive to use-case scenario and capacity demand, with any one, two or three of the three antenna groups enabled, and with routing of any combination of contiguous or non-contiguous CC for carrier overlay or carrier aggregation.

14. An apparatus for dynamic carrier aggregation to antenna mapping in a radio access network comprising:
a baseband processor having a communication interface for data and control signals;
a plurality of radio-frequency (RF) transceivers which collectively provide bandwidth for operation with multiple contiguous and non-contiguous component carriers (CC) of at least one spectral band;
the baseband processor serving each of the plurality of RF transceivers through respective digital interfaces;
a plurality of RF front ends;
a plurality of antenna groups each comprising a plurality of directional antenna elements;
each RF transceiver having an interconnection with a single one of the plurality of RF front ends;
each RF front end having an antenna port with an interconnection to a respective one of the plurality of antenna groups; and
the plurality of RF front ends being interconnected in a daisy chain configuration wherein, for N being an integer greater than 1, RF front end N has an interconnection with RF front end N−1 and an interconnection with RF front end N+1; and wherein each RF front end comprises an isolation module, and each isolation module comprises first and second isolation blocks,
the first block of the isolation module of RF front end N being linked to the RF transceiver N and linked to the second isolation block of RF Front end N−1;
the second block of the isolation module of RF front end N being linked to the antenna port of antenna group N and linked to the first isolation block of RF front end N+1;
the first isolation block comprising software configurable switches configurable for selecting and routing transmit signals $TX_N$ from RF transceiver N and $TX_{N-1}$ from the isolation module of RF front end N−1, and receive signals $RX_N$ from antenna group N and $RX_{N-1}$ from the isolation module of RX Front end N−1; and
the second isolation block comprising software configurable switches configurable for selecting and routing of transmit signals $TX_N$ from RF transceiver N and $TX_{N+1}$ from the isolation module of RF Front end N+1, and receive signals $RX_N$ from antenna group N and $RX_{N+1}$ from the isolation module of RF Front end module N+1.

15. The apparatus of claim 14, wherein said interconnections comprise an interconnection between the isolation module of a last RF front end in the daisy chain and the isolation module of a first RF front end 1, to form a closed-loop daisy chain.

16. The apparatus of claim 14, wherein said software configurable switches comprise an arrangement of software configurable bidirectional switches.

17. A multi-beam antenna system comprising a plurality of groups of directional antenna elements B0, B1 . . . BN, where N is an integer greater than 1,
a plurality of RF transceivers providing bandwidth for operation with multiple contiguous and non-contiguous component carriers (CC) of at least one spectral band,
a plurality of RF front ends,
each RF transceiver being interconnected with a single one of the RF front ends, and
each group of antenna elements being interconnected to an antenna port of a respective one of the RF front ends,
each of the plurality of RF front ends comprising front end circuitry for selectively enabling and disabling the antenna group connected to its antenna port;
the plurality of RF front ends being interlinked in a daisy chain configuration,
each RF front end comprising an isolation module comprising software configurable switches wherein switch configurations enable an RF data stream from each of the RF transceiver ports to be routed through the daisy chain to any one of the antenna groups or to multiple antenna groups and enable an RF data stream from each of the antenna groups to be routed through the daisy chain to any one of the RF transceivers.

18. The multi-beam antenna system of claim 17, wherein said switch configurations provide that a component carrier physically linked to a disabled antenna group is routed to a next enabled antenna group.

19. The multi-beam antenna system of claim 17, wherein said switch configurations provide for dynamically enabling/disabling antenna groups and dynamic mapping of component carriers to antenna groups for operation in a plurality of modes of operation responsive to use-case scenario and capacity demand.

20. The multi-beam antenna system of claim 17, wherein each antenna group provides a different pattern of directional coverage, said switch configurations provide for dynamically enabling/disabling antenna groups to provide one of a set of predetermined coverage patterns responsive to use-case scenario and to adapt to different network morphologies.

21. The multi-beam antenna system of claim 17, comprising 3 antenna groups wherein antenna group B0 comprises a first set of directional antenna elements providing bi-directional coverage; antenna group B1 comprises a second set of directional antenna elements providing bi-directional coverage orthogonal to the first antenna group; and antenna group B2 comprises a third set of directional antenna element filling nulls of antenna groups B0 and B2.

22. The multi-beam antenna system of claim 21, wherein
for a first use-case, a first mode of operation comprises enabling one of antenna group B0 and antenna group B1 to provide bi-directional coverage;
for a second use-case, a second mode of operation comprises enabling antenna groups B0 and B1 to provide four-directional coverage; and
for a third use-case, enabling antenna group B2 or enabling antenna groups B0, B1 and B2 to provide omnidirectional or quasi-omnidirectional coverage.

23. The multi-beam antenna system of claim 21, configured for operation with three component carriers, contiguous or non-contiguous, and wherein said switch configurations provide for modes of operation comprising carrier overlay and carrier aggregation.

24. The multi-beam antenna system of claim 17, wherein dynamic mapping of carrier components to antenna groups responsive to capacity demand comprises any one of:
one antenna group is enabled and one CC maps to the one antenna group;
multiple antenna groups are enabled and one CC maps to each enabled antenna group for carrier overlay of multiple CCs;
one antenna group is enabled for carrier aggregation wherein multiple component carriers are mapped to the one antenna group;
multiple antenna groups are enabled, at least one antenna group being enabled for carrier aggregation of multiple CCs; and
a combination thereof.

25. A method of dynamic carrier aggregation to multi-beam antenna mapping in a small cell radio access network comprising a plurality of base stations and a distributed or centralized network controller, each base station comprising an apparatus as defined in claim 8, comprising:
obtaining at least one of measured and predicted data indicative of parameters of the radio frequency environment relating to capacity demand;
based on said at least one of measured and predicted data, selecting an operational mode from one of a plurality of modes, each mode specifying which antenna groups are enabled/disabled and specifying a mapping of component carriers to each enabled antenna group; and
issuing instructions to RF front end circuitry to enable/disable one or more antenna groups, and providing a switch configuration for the software configurable switches of the isolation modules to route selected carrier components for RX and TX for each enabled antenna group, thereby dynamically mapping carrier components to antenna groups responsive to capacity demand.

* * * * *